United States Patent [19]
Nakajima

[11] Patent Number: 4,829,669
[45] Date of Patent: May 16, 1989

[54] METHOD OF MANUFACTURING A CHIP CARRIER

[75] Inventor: Hirofumi Nakajima, Tokyo, Japan
[73] Assignee: NEC Corporation, Tokyo, Japan
[21] Appl. No.: 187,148
[22] Filed: Apr. 28, 1988
[51] Int. Cl.⁴ .......................................... H01R 43/16
[52] U.S. Cl. ...................................... 29/874; 29/827; 29/838; 72/337; 174/52.4
[58] Field of Search .................. 29/827, 838, 874; 72/339, 379; 174/53 FP; 140/105

[56] References Cited

U.S. PATENT DOCUMENTS

| | | | |
|---|---|---|---|
| 3,416,348 | 12/1968 | Carter, Jr. et al. | 29/827 X |
| 4,195,193 | 3/1980 | Grabbe et al. | 174/52 FP |
| 4,463,217 | 7/1984 | Orcutt | 174/52 FP |
| 4,465,898 | 8/1984 | Orcutt et al. | 174/52 FP |
| 4,495,376 | 1/1985 | Hightower et al. | 174/52 FP |
| 4,553,420 | 11/1985 | Fierkers et al. | 29/827 X |
| 4,611,398 | 9/1986 | Eames et al. | 174/52 FP X |
| 4,698,660 | 10/1987 | Kubola et al. | 174/52 FP X |

FOREIGN PATENT DOCUMENTS

| | | | |
|---|---|---|---|
| 61-69758 | 4/1986 | Japan | 29/827 |
| 61-236146 | 10/1986 | Japan | 29/838 |

OTHER PUBLICATIONS

IBM Tech. Discl. Bull., vol. 1, No. 4, Dec. 1958, by Vullemier, p. 28.

Primary Examiner—Carl J. Arbes
Attorney, Agent, or Firm—Sughrue, Mion, Zinn, Macpeak & Seas

[57] ABSTRACT

A method of manufacturing a chip carrier having the J-shaped leads extending from the lateral sides of the enclosure of the chip carrier with the end facing the bottom of the enclosure is disclosed. The leads first extending laterally is made to have a circular arc at its end portion by use of a roller and then bent downward by using a die and then a roller, hollowed by being further curled by use of a roller to bring the end thereof to face the bottom of the enclosure.

7 Claims, 2 Drawing Sheets

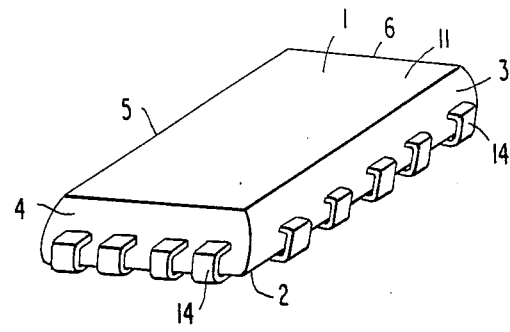
FIG. 1A
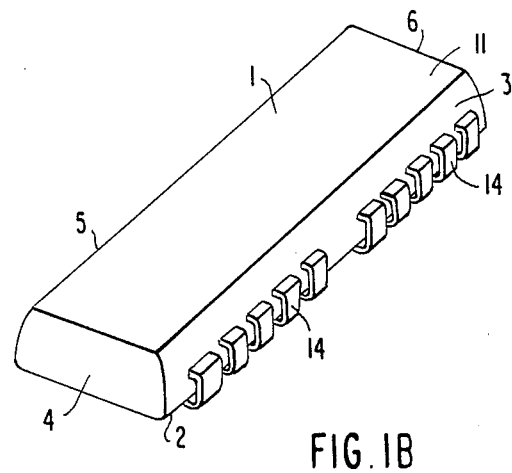
FIG. 1B
FIG. 3
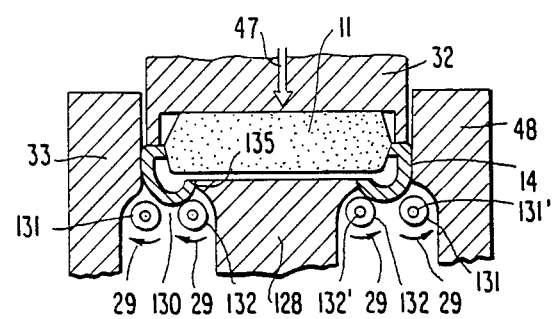

METHOD OF MANUFACTURING A CHIP CARRIER

BACKGROUND OF THE INVENTION

The present invention relates to a method of manufacturing a chip carrier which carries an integrated circuit semiconductor chip (IC chip) in an enclosure of an insulating material such as plastics and ceramics. In more particular, the present invention relates to a method of shaping leads protruded from lateral sides of the chip carrier enclosure into the form of the letter "J".

The method of forming the J-shaped leads in a prior art chip carrier comprises cutting the straight leads protruded from the lateral sides of the enclosure at a predetermined length and bending the leads downward at an angle of about 45 degrees by use of a punch at an upper position and a die at a lower position. The bent leads are further bent vertically by a punch, followed by being curled to bring the end of lead into a position facing the bottom of the enclosure by using a punch which depresses the leads and a curling die having a half-circled trench which receives the depressed leads.

The prior art method relies only upon forces in the vertical direction applied by the punches and dies. Therefore, a plated layer on the surface of leads is apt to be shaved off. Moreover, in the final curling process, the curling die having the half-circular trench is positioned under the processed chip carrier. Therefore, the shaved wastes of the plated layer and wastes of plastic material removed from the enclosure at the roots of the leads fall into the trench and accumulated on the bottom of the trench. Consequently, the wastes are embedded into the surface of the leads which are processed with the curling die. The wastes of the plated layer attached to the leads would cause short-circuit between leads, and the plastic wastes embedded in the surface of the leads would prevent good expansion of a solder over the surface of the leads when the leads of the plastic chip carrier is soldered to a printed circuit board.

SUMMARY OF THE INVENTION

Accordingly, an object of the invention is to provide a method of manufacturing a chip carrier in which J-shaped leads can be formed with a reduced amount of wastes.

Another object of the invention is to provide a method of forming J-shaped leads of a chip carrier in which wastes in the lead curling process can be easily removed from the equipment used in that process.

According to the present invention, there is provided a method of manufacturing a chip carrier which comprises a first step of cutting leads extending laterally from lateral sides of the enclosure of the chip carrier at a predetermined length, a second step of lifting the leads upwards and curling an end portion of the lifted leads by use of a roller vertically going down, a third step of bending the leads downward at an angle less than 90° under a condition of clamping the root of the leads, a fourth step of bending down the leads vertically by use of a roller vertically going down, and a fifth step of curling the leads by use of a roller or rollers positioned under the leads to bring the end of the leads to a position facing the bottom of the enclosure.

In the second step, the leads may be lifted upwards at an angle less than 90° from the horizontal plane. The angle ranges favorably from 20 degrees to 60 degrees. For example, if the angle is 45 degrees, the end portion of the leads is curled to have a circular arc of about ⅜ arc of the circle by the roller which goes down to apply a downward force to the end portion of the leads. The present invention is featured by this curling process at an early stage to make an circular arc beforehand at the end portion of the leads. This reduces the burden or load in the later curling process to a significant extent. Moreover, this curling process to make the circular arc is conducted by use of a freely rotatable rollar which rotates when contacted to the leads. Therefore, the plated surface of the leads is hardly shaved or torn off. In the third step, the leads may be bent downwards by use of a die, and the angle of the bend is favorably from 20 degrees to 50 degrees from the lateral or horizontal direction. If the angle exceeds 50 degrees, the plated surface of the leads is apt to be shaved. On the other hand, if the angle is less than 20 degrees, the burden in the next fourth step would be increased to bend the lead vertically by use of the roller. In the fourth and fifth steps, the plated surface of the leads is hardly shaved or torn off because of the freely-rotatable rollers. In the fifth step, the roller positioned under the leads may be favorably installed in an opening or a hollow portion of a vacuum chamber. The wastes of the removed plastic pieces, the wastes of the plated surface which might be slightly shaved and other foreign substances can be effectively exhausted externally by the absorbing force of the vacuum chamber and by the rotation of the roller. The fifth step may employ a curling die located below the bottom of the enclosure and having a curled upper edge whose cross section has about one quarter arc of a circle and fits the final shape of the J-leads, together with one roller. The curling die may have a curled upper edge of an arc small than a quarter arc of a cicle, with a pair of rollers engaged with the curling die. In any case, the roller or rollers are provided instead of the conventional curling die which has a concavity of a half arc of a circle, with the above-mentioned advantageous effects.

In the present specification, the words "vertically", "horizontal" etc. are used for the enclosure of the chip carrier placed horizontally and they should be read as "horizontally", "vertical" etc., respectively, when the enclosure is vertically placed.

BRIEF DESCRIPTION OF DRAWINGS

FIG. 1A and FIG. 1B are perspective views of examples of chip carriers, respectively, to which the present invention is applied;

FIG. 3 is cross-sectional view showing a second embodiment of the present invention.

EMBODIMENT

Figure 2A:
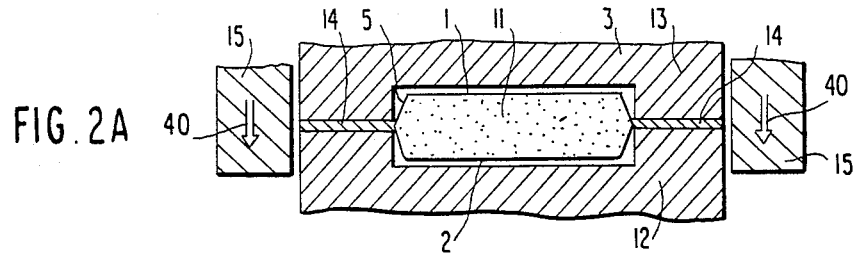
FIGS. 2A to 2E are cross-sectional views showing a first embodiment of the present invention in sequence.

Referring to FIGS. 1A and 1B, each of the chip carriers includes an enclosure 11 made of a plastic or ceramic material, in which are IC chip is hearmetically housed, and a plurality of J-shaped leads 14. The enclosure 11 has an upper surface 1, a bottom 2 and four lateral sides 3, 4, 5 and 6. FIG. 1A shows a 14-pin IC in which five leads 14 are led out from longer lateral sides 3 and 5 and four leads 14 are led out from shorter lateral sides 4 and 6. The four lateral sides may have the same length and the same number of the J-shaped leads may be extended therefrom. For example, the number of the leads at each lateral side may be 17 for a 68-pin IC and 21 for as 84-pin chip carrier. On the other hand, the 20-pin chip carrier, the so-called SOJ IC, shown in FIG. 1B has ten leads 14 are led out from the longer sides 3 and 5 and no leads from the shorter sides 4 and 6. The 20 leads are grouped into four groups having five leads, as shown.

All the leads 14 are led out of the lateral sides of the enclosure 11 laterally, bent downwards, and curled toward the bottom 2 of the enclosure. The end of the leads 14 faces the bottom 2.

Referring to FIGS. 2A to 2E, process steps in the first embodiment of the invention will be described.

It is to be noted here that manufacturing tools and equipment in the respective process steps are installed separately for each step and the plastic chip carriers are transferred from one stage to another in sequence to be subjected to the respective process steps. After the final stage shown in FIG. 2E, the chip carrier shown, for example, in FIG. 1B with the completed J-leads is removed from the apparatus seen in FIG. 2E. Further, in each of FIGS. 2A to 2E, the enclosure 11 is held such that the upper surface 1 and bottom 2 are horizontally kept, and in FIG. 2A, the leads 14 are horizontally extended from the lateral sides of the enclosure 11. Moreover, to avoid complexity, the inside of the enclosure 11 is not shown. Actually an IC chip (not shown) is placed in the enclosure 11 and its electrodes are electrically connected to the inner ends of the leads 14. Further, a plurality of leads to be formed are provided as shown in FIG. 1, and two of leads are shown in FIG. 2. However, the following explanation is made on one lead.

At first, a first process step is conducted by use of tools and equipment shown in FIG. 2A. A pad 13 and a die 12 are installed above and below the enclosure 11, respectively, with small clearances from the upper surface 1 and the bottom 2, respectively, and the leads 14 extending horizontally from the lateral sides 3 and 5 of the enclosure 11 are clamped by the pad 13 and die 12. A cutting punch 15 is vertically fallen in the direction as shown by arrow 40, and the leads 14 are cutted to have a predetermined length.

Figure 2B:
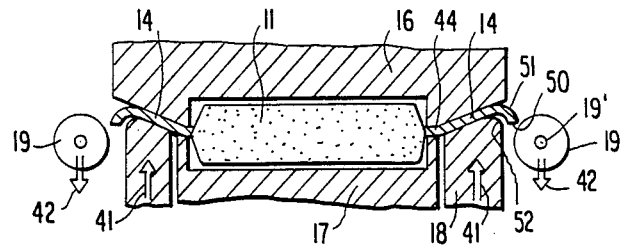

The IC is sent to the next stage shown in FIG. 2B, where a second step is conducted. The root 44 of the leads 14 is first supported by a lower die 17. The leads 14 are lifted, as explained later, upwards by a lead forming die 18 which contacts the lower face of the leads 14 except its root 44 and end portion 51 adjacent to the end 50 of the lead. The lead forming die 18 has the sloped top surface and the rounded end 52. A punch 16 is vertically fallen on the upper face of the leads. The punch 16 has a horizontal surface portion to contact to the root 44 of the lends and a sloped surface portion above the lead forming die 18. When the punch 16 is contacted to the upper face of the root 44 of the lead, the lower die 17 is sunk and the lead is clamped by the punch 16 and the dies 17 and 18, as shown in FIG. 2B. Thus, the force 41 is generated and the leads 14 except the root 44 are lifted or inclined upwardly. Then, a roller 19 is vertically fallen as shown by an arrow 42 to curl the end portion 51 adjacent to the end 50 of the lead 14 to have a circular arc. The roller 19 can be freely rotated with the axis 19' when the roller 19 is contacted to the lead 14. The axis 19' is supported by a well known bearing means (not shown) which is installed in a moving member (not shown). The roller 19 moves vertically by the moving member.

Figure 2C:
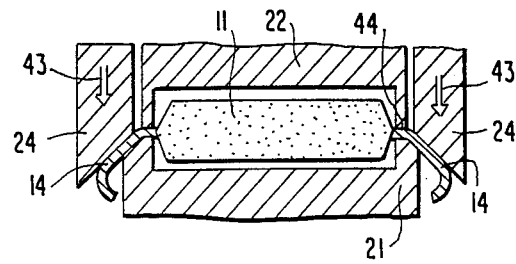
Figure 2D:
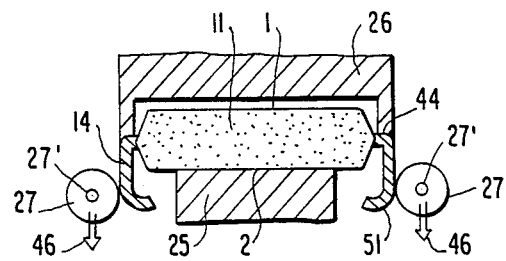

The enclosure 11 with the leads having the curled end portion is sent to the next stage shown in FIG. 2C and a third step is conducted. The root 44 of the lead 44 is clamped at a horizontal position by a pad 22 and a die 21. The die 21 has a horizontal surface portion to clamp the root 44 of the lead and a downwardly sloped surface portion. A punch 24 having a downwardly sloped bottom is vertically fallen as shown by an arrow 43 to bend the leads 14 downwards at an angle of the sloped surfaces. In the next stage shown in FIG. 2D, the enclosure 11 is placed on a die 25 with the bottom 2 contacted to the top of the die 25. With the root 44 of the leads 14 is supported at its upper face by a pad 26, a roller 27 is vertically fallen as shown by an arrow 46 to bend vertically the leads 14. Thus, a vertical portion of the leads 14 between the root portion 44 and the end portion 51 is shaped. The roller 27 can be freely rotated with the axis 27' when the roller is contacted to the lead 14. The axis 27' is supported by a well known bearing means (not shown) which is installed in a moving member (not shown). The roller 27 moves vertically by the moving member.

Figure 2E:
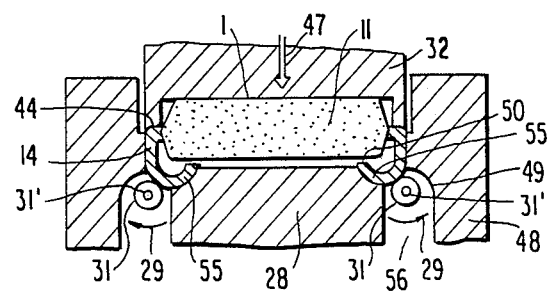

The enclosure 11 is then sent to the final stage shown in FIG. 2E where a final curling step is conducted. A curling die 28 has a flat top surface and a pair of curled top edges 55 of about one quarter arc of a circle (90 degrees circular arc). The vertical portion of the leads is supported by a side die 48 which has a concavity 49 at its lower inside wall where a roller 31 is placed. The curling die 28 and the side die 48 may be made of a single body, or may be set separately. In either case, a vacuum chamber is constituted at least by use of these dies 28 and 48. The vacuum chamber has a hollow or opening portion 56 through which air is exhausted together with wastes and in which the roller 31 is installed. A curling punch 32 is contacted to the upper surface 1 of the plastic enclosure 11 and to the root 44 of the leads 14, and applies thereto a pressure as shown by an arrow 47. As a result, the circular arc end portion 51 of the leads 14 is pressed to the roller 31 and further curled gradually toward the curled top edge 55 with the rotation 29 of the roller 31. Not only the end portion 51 but a part of the vertical portion of the leads 14 are curled and the end 50 of the leads 14 moves along the surface of the curled edge 55 of the curling die 28 and faces the bottom 2 of the enclosure 11. Thus, the J-leads with a half circle are shaped. The curling work is easily conducted because the end portion 51 of the leads 14 has been shaped to have the circular arc beforehand. If the leads 14 do not have the curled end portion 51, the leads 14 would not be curled by the roller 31 but go straight. Further, the wastes and foreign substances produced in the curling step can be effectively exhausted to the outside through the opening 56 by the absorbing force of the vacuum and the rotation 29 of the roller 31. The roller 31 is freely rotated with the axis 31' when contacted to the leads 14. The axis 31' is held by a well known bearing means (not shown) which is installed in a support member (not shown). The rollers 31 in the fifth step do not more vertically.

Referring to FIG. 3, the second embodiment is shown. The first to fourth process steps are the same as the first embodiment shown in the FIGS. 2A to 2D. However, in the second embodiment, the final curling step is modified from the method shown in FIG. 2E of the first embodiment to a method shown in FIG. 3. In FIG. 3, the same components as those in FIG. 2E are indicated by the same reference numerals. A pair of rollers 131 and 132 are provided at an opening 130 which is broader than the opening 56 in the first embodiment, and the wastes produced in the curling process step are rejected from the opening 130 as the first embodiment. The lead 14 is curled by the rollers 131 and 132 and guided to a small curled edge 135 of the curling die 128. In the second embodiment, curling is conducted by the pair of rollers 131 and 132, and the curled edge 135 is used as a guide to lead the end of the leads 14 toward the bottom of the enclosure 11. The rollers 131 and 132 are rotated as shown by arrows 29 with respective exes 131', 132' by the action from the leads contacting the rollers. The lead is at first contacted to the roller 131 and, after curled to some extend by the roller 131, contacted to the roller 132. The axes 131', 132' are supported by a well known bearing means (not shown) which is installed in a support member (not shown) and prevents vertical movement of the rollers 131 and 132.

In the second embodiment, the plated surface of the leads 14 is more hardly shaved because the leads are only contacted to a small area of the edge 135.

When the chip carriers having the leads 14 extended from all the four lateral sides 3, 4, 5 and 6 as shown in FIG. 1A are processed, all the leads 14 from the four lateral sides of the enclosure 11 are simultaneously shaped in the first, second and third steps shown in FIGS. 2A, 2B and 2C in consideration of working efficiency. However, in the fourth steps shown in FIG. 2D, for working securely, the two sets of leads from the opposite lateral sides 3 and 5 are first subjected to the vertically bending process, and thereafter the remaining leads led out of the other opposite lateral sides 4 and 6 are vertically bent down. With respect to the final curling step, it is practically favorable in consideration of both working efficiency and reliability that in the case of 18-pin type chip carrier, all the leads from the four sides 3, 4, 5 and 6 are simultaneously worked as in the first to third steps, and in the case of 68-pin and 84-pin type chip carriers, the leads 14 led out of opposite sides 3 and 5 and the leads 14 from the other opposite sides 4 and 6 are separately worked as in the fourth step.

According to the present invention, the plated surface of the leads is hardly shaved or torn, and therefore, the adhering of the wastes to the tools and equipment becomes extremely small. Consequently, cleaning of the tools and equipment can be done only after every 50,000 chip carrier's are subjected to the J-lead shaping. On the other hand, in the prior art, cleaning must be done after evey 2,000 chip carrier's are processed. Further, a short-circuiting phenomenon between leads is eliminated because the unfavorable attachment of the shaved plated surface to the curling tools can be avoided.

Moreover, the occurrence of the attachment of the plastic wastes to the leads becomes zero according to the present invention. Whereas, in the curling step of the prior art, it is 50% in the processed leads. Consequently, the chip carrier by the present invention can be securely soldered to a printed circuit board with a good expansion of the solder over the lead surface. Any working to remove the attached plastic wastes from the leads is not necessary.

The present invention effects enables the use of the tools in highly efficiency because of decreasing the cleaning times. Moreover, a high quality and low cost product can be obtained by an enhanced automation in the product line because the attachment of the wastes to the leads in the curling step are prevented.

What is claimed is:

1. A method of manufacturing a chip carrier comprising the steps of cutting leads extending laterally from lateral sides of an enclosure of said chip carrier at a predetermined length, lifting said leads upwards, curling an end portion of the lifted leads by use of a roller vertically going down, bending the leads downward at an angle less than 90° with the root of said leads clamped, bending down said leads vertically by use of a roller vertically going down, and curling further said leads by use of at least one roller positioned under said leads to bring the end of said leads to a position facing the bottom of said enclosure.

2. A method of claim 1, in which said leads are lifted upwards at an angle of 20° to 60° from the lateral direction before the end portion thereof is curled.

3. A method of claim 1, in which said leads are bent downwards at an angle of 20° to 50° from the lateral direction after the end portion thereof is curled.

4. A method of claim 2, in which said leads are further curled to bring the end thereof to face the bottom of said enclosure by using a curling die located below the bottom of said enclosure and having a curled upper edge, a side die located near the lateral side of said enclosure and supporting a portion of said leads extending vertically and the roller which is positioned between said curling die and said side die.

5. A method of claim 4, in which said curling die and said side die constitute a vacuum chamber having a hollow portion therebetween through which air is exhausted, said roller being provided at said hollow portion of said vacuum chamber.

6. A method of claim 4, in which a pair of rollers are positioned between said curling die and said side die.

7. A method of claim 1, in which the rollers used in said curling steps and in said bending step are rotated when contacted to said leads.

* * * * *

UNITED STATES PATENT AND TRADEMARK OFFICE
CERTIFICATE OF CORRECTION

PATENT NO. : 4,829,669

DATED : May 16, 1989

INVENTOR(S) : Hirofumi Nakajima

It is certified that error appears in the above-identified patent and that said Letters Patent is hereby corrected as shown below:

On the title page:

Please add the following priority information --Japanese Application No. 107401/1987, filed April 28, 1987--.

Signed and Sealed this

Twentieth Day of November, 1990

Attest:

HARRY F. MANBECK, JR.

*Attesting Officer*  *Commissioner of Patents and Trademarks*